United States Patent
de Bie

(10) Patent No.: US 10,906,382 B2
(45) Date of Patent: Feb. 2, 2021

(54) ROOF CONSTRUCTION FOR A VEHICLE AND A SEMI-TRANSPARENT PHOTO VOLTAIC PANEL THEREIN

(71) Applicant: Inalfa Roof Systems Group B.V., Oostrum (NL)

(72) Inventor: Sander de Bie, Nuth (NL)

(73) Assignee: INALFA ROOF SYSTEMS GROUP B.V., Oostrum (NL)

( * ) Notice: Subject to any disclaimer, the term of this patent is extended or adjusted under 35 U.S.C. 154(b) by 0 days.

(21) Appl. No.: 16/232,331

(22) Filed: Dec. 26, 2018

(65) Prior Publication Data
US 2019/0207046 A1 Jul. 4, 2019

(30) Foreign Application Priority Data
Dec. 28, 2017 (DE) .................... 20 2017 107 931 U

(51) Int. Cl.
| | | |
|---|---|---|
| B60J 7/043 | (2006.01) | |
| H01L 31/0468 | (2014.01) | |
| H01L 31/05 | (2014.01) | |
| H02S 20/00 | (2014.01) | |
| H01L 31/048 | (2014.01) | |
| H01L 31/0465 | (2014.01) | |
| H02S 10/40 | (2014.01) | |

(Continued)

(52) U.S. Cl.
CPC .......... *B60J 7/043* (2013.01); *H01L 31/0465* (2014.12); *H01L 31/0468* (2014.12); *H01L 31/0488* (2013.01); *H01L 31/0504* (2013.01); *H02S 10/40* (2014.12); *H02S 20/00* (2013.01); *H02S 20/30* (2014.12); *H01G 9/2009* (2013.01); *H01L 31/0322* (2013.01); *H01L 31/03762* (2013.01)

(58) Field of Classification Search
CPC ............... H01L 31/042; H01L 31/0465; H01L 31/0488; H01L 31/0504
USPC ................................ 296/211; 136/291, 252
See application file for complete search history.

(56) References Cited

U.S. PATENT DOCUMENTS

| 6,682,132 B1 | 1/2004 | Hahn | |
| 8,628,993 B2 * | 1/2014 | Moldovan | ............ B23K 26/361 438/57 |

(Continued)

FOREIGN PATENT DOCUMENTS

| DE | 19852383 A1 | 5/2000 |
| DE | 10328092 A1 | 1/2005 |
| WO | 2017024945 A1 | 2/2017 |

OTHER PUBLICATIONS

German Search Report, dated Sep. 17, 2018 for corresponding German Patent Application No. 202017107931.7, filed Dec. 28, 2017.

(Continued)

*Primary Examiner* — Dennis H Pedder
(74) *Attorney, Agent, or Firm* — Steven M. Koehler; Westman, Champlin & Koehler, P.A.

(57) ABSTRACT

A roof construction for a vehicle having an opening in its fixed roof, comprises at least one panel for at least closing said opening. The panel comprises a first and a second layer of glass and in between said first and second layer of glass a sheet of photo voltaic cells as a third layer. The sheet of photo voltaic cells has an active layer of a thin film of solar cell material and further has a first area which is semi-transparent and a second area which is substantially opaque.

13 Claims, 7 Drawing Sheets

(51) Int. Cl.
*H02S 20/30* (2014.01)
*H01G 9/20* (2006.01)
*H01L 31/032* (2006.01)
*H01L 31/0376* (2006.01)

(56) References Cited

U.S. PATENT DOCUMENTS

| | | |
|---|---|---|
| 8,952,236 B2 | 2/2015 | Song et al. |
| 2010/0078064 A1* | 4/2010 | Coakley ............ H01L 31/03685 |
| | | 136/246 |
| 2016/0126385 A1 | 5/2016 | Kim et al. |
| 2017/0104117 A1* | 4/2017 | Davey ..................... H01L 31/04 |
| 2017/0145173 A1* | 5/2017 | Matsunaga ................ C08J 3/16 |
| 2017/0194523 A1* | 7/2017 | Kim .................. H01L 31/02168 |

OTHER PUBLICATIONS

European Search Report dated May 29, 2019, for corresponding European Patent Application No. 18215678.6, filed Dec. 21, 2018.
EP Communication from the European Patent Office for European patent application No. 18215678.6, dated Sep. 11, 2020.

* cited by examiner

ROOF CONSTRUCTION FOR A VEHICLE AND A SEMI-TRANSPARENT PHOTO VOLTAIC PANEL THEREIN

BACKGROUND

The discussion below is merely provided for general background information and is not intended to be used as an aid in determining the scope of the claimed subject matter.

Aspects of the invention firstly relate to a roof construction for a vehicle having an opening in its fixed roof, comprising at least one panel for at least closing said opening, said panel comprising a first and a second layer of glass and in between said first and second layer of glass a sheet of photo voltaic cells as a third layer.

Such a roof construction is known from U.S. Pat. No. 8,952,236 B2 in which a hybrid type of roof panel is disclosed having a first type of semi-transparent solar cells (for instance a dye-sensitized solar cell module) provided in the center of the panel and a second type of solar cells having better photovoltaic performance (for instance a silicon solar cell module) in an edge area of the panel. The first and second type of solar cells may be electrically interconnected by wires. The disadvantage of such hybrid module is that because each of the type of solar cell module is manufactured separately and has a particular individual thickness which may not be the same, it takes extra effort to incorporate these different solar cell module types into a panel, involving extra measures to adopt the different thicknesses of the cells and to adopt separate electrical connections in between the different solar modules. Also differences in color may occur when using two different types of solar cell modules, which for esthetical reasons, is less desirable when using such a panel in a vehicle.

SUMMARY

This Summary and the Abstract herein are provided to introduce a selection of concepts in a simplified form that are further described below in the Detailed Description. This Summary and the Abstract are not intended to identify key features or essential features of the claimed subject matter, nor are they intended to be used as an aid in determining the scope of the claimed subject matter. The claimed subject matter is not limited to implementations that solve any or all disadvantages noted in the Background.

A roof construction has a sheet of photo voltaic cells that have an active layer of a thin film of solar cell material and further have a first area which is semi-transparent and a second area which is substantially opaque.

In this manner, because of the thickness of the whole sheet of photo voltaic cells being the same and the electrical connections between the first and second area are integrated in the sheet of the photo voltaic cells, no additional measures in this area need to be taken which makes the present invention cheaper in manufacturing and the electrical reliability may increase. Also aesthetically the present invention may be more attractive for the use in a vehicle, since the color of the photo voltaic cells in the different areas is the same.

In one aspect of the invention the semi-transparent first area is substantially located in the central area of the panel and the substantially opaque second area is located near the edge of the panel. As such, light will enter the interior of the vehicle in this centrally positioned semi-transparent area of the panel, in this manner a transparency of up to 20% can be reached.

According to another aspect of the invention the semi transparency of the photo voltaic cells in the first area is created by laser engraving of lines into the active surface of the photo voltaic cells such that visible light can travel through the engraved lines.

According to another aspect of the invention, by creating laser engraved lines, not only a semi-transparency is created but also isolated photo voltaic cells are created in such a way that the sheet of photo voltaic cells comprises a sequence of individual photo voltaic cells, the boundaries of which are formed by laser engraved lines into the photo voltaic cell material and wherein the photo voltaic cells are electrically connected to each other.

According to another aspect of the invention, when using these isolated photo voltaic cells, it is possible to arrange them electrically in a parallel and or serial circuits. Such that a first sequence of individual photo voltaic cells is electrically connected in series to each other and wherein said first sequence of photo voltaic cells extends adjacent to each other in a first direction on the panel.

According to another aspect of the invention, in one direction the photo voltaic cells are created in series which determines an electrical potential in one direction, and by circuiting these first sequence of cells in a second direction in parallel with other adjacent positioned first sequences it is possible to increase the basic voltage of 0.85 V to a maximum voltage of 60 Volts. This can be done by the arrangement of a second sequence of first sequences of in series connected photo voltaic cells are connected to each other in parallel and wherein said second sequence of a first sequence of in series connected photo voltaic cells lie adjacent to each other in a second direction which is perpendicular to the first direction.

According another aspect of the invention, it is best practise to arrange the number of second sequences of in parallel connected cells adjacent to each other on the sheet of photo voltaic cells such that it is an integer value.

According another aspect of the invention the first direction of the first sequence of photo voltaic cells is a direction which is longitudinal with regard to a longitudinal direction of the vehicle. However it may be conceivable that the first direction is in a transverse direction with respect to the vehicle.

According another aspect of the invention the lower side of the sheet of photo voltaic cells is provided with a layer of black ink in a third area along the circumferential edge of said sheet. The black ink provides a blocking layer to the UV light which may protrude through the engraved lines in this particular area. Such UV light may have a detrimental effect on the PU encapsulation material or PU glue. Thus the third area, provided with a layer of black ink, covers an area which is a projection of an area on the lower side of the panel, comprising a mechanism bracket and or a reinforcement and material to fix said bracket and or reinforcement to the lower side of the panel by means of encapsulation material or glue.

According another aspect of the invention the sheet of photo voltaic cells comprises a thin support layer and deposited on this a thin layer of solar cell material which is the active layer. The thin support layer may be a thin film of chemical tempered glass or a layer of plastic foil having a thickness of less than 1 mm.

In another embodiment the thin film of solar cell material comprises a layer of amorphous silicon material.

According another aspect of the invention the photo voltaic cells of amorphous silicon provided on the sheet of photo voltaic cells are either of the type of the so called semi-transparent single junction, semi-transparent tandem junction or triple junction. These various types of photo voltaic cells have different levels of efficiency, but also they are different in cost price.

In yet another embodiment the thin film of solar cell material comprises a layer of either of CIGS material, CIS material or Perovskite material.

According another aspect of the invention the panel comprises encapsulation material around the circumferential edge of the panel and wherein the first and second layers of glass comprises a ceramic layer on the lower side of each of said layers. The ceramic layer is necessary in the manufacturing of the glass, in this embodiment the ceramic layers can be substantially the same size for the first and second layers of glass.

According another aspect of the invention a sequence of in series connected photo voltaic cells in the first semi-transparent area has photo voltaic cells having a first rectangular area which is smaller than a second rectangular area of the photo voltaic cells in the second opaque area, and wherein the boundary between the first semi-transparent area and opaque second area is created by a sequence of laser engraved lines between photo voltaic cells having a first rectangular area and photo voltaic cells having a larger second rectangular area. As such the boundary is a sharp line engraved in the active material which forms the boundary. It is also conceivable that in another embodiment the boundary between the first semi-transparent area and opaque second area is created by sequences of in series and in parallel connected photo voltaic cells that gradually grow in steps from the first rectangular area to the second rectangular area. In this way there is not a sharp line between the two areas, but an area of cells which gradually increase in size which may be aesthetically of value.

In another embodiment the semi transparency of the photo voltaic cells in the first area is created by laser engraving of holes into the active layer of the photo voltaic cells such that visible light can travel through the engraved holes.

BRIEF DESCRIPTION OF THE DRAWING

Herein after aspects of the invention will be further elucidated while referring to the drawings, in which.

DETAILED DESCRIPITON

Figure 1:
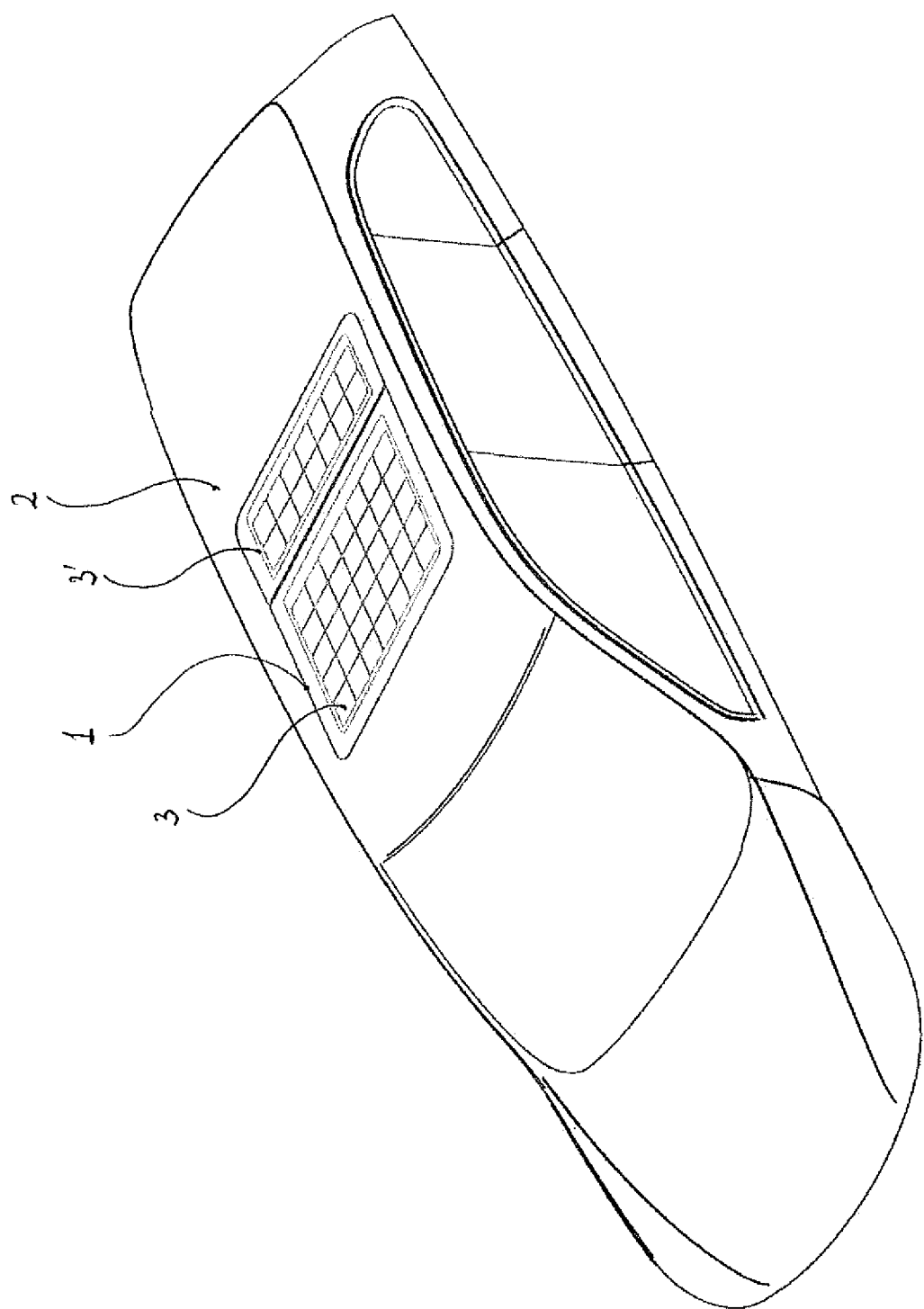
FIG. 1 is a schematic perspective view of a vehicle comprising the roof construction.

Referring to FIG. 1 a vehicle is shown having an opening 1 in its fixed roof 2 and two panels 3, 3' closing off the roof opening 1. These two panels 3, 3' are part of an open roof construction capable of closing the roof opening 1 and at least partially opening the roof opening 1. The most forward panel 3 of the two panels 3, 3' seen in longitudinal forward direction with respect of the vehicle and its forward driving direction is a movable panel. For example, it may be tiltable and/or slidable. The rear panel 3' may be movable too, but is usually a stationary panel. On the other hand, both panels 3, 3' may be stationary, or the fixed roof may be equipped with one large stationary panel 3.

Both of the panels 3, 3' are equipped with photo voltaic cells 6 in order to generate electric energy. It is conceivable that the open roof construction comprises just one panel 3 having photo voltaic cells 6. The movable panel 3 is capable of moving rearward on the outside of the vehicles fixed roof, or is capable of moving rearward below the fixed roof 2. The invention is not limited to a number of panels, nor is it limited to the aspect that the panel is being movable. In FIG. 1 each of the panels 3, 3' is equipped with a sheet of photovoltaic cells 6. The photo voltaic cells 6 may be either of the type of amorphous silicon, CIGS, CIS or Perofskite material. In case the photo voltaic cells 6 are made of amorphous silicon it is conceivable that the cells are either of the type of single junction (also known as mono junction), dual junction or triple junction.

Figure 2:
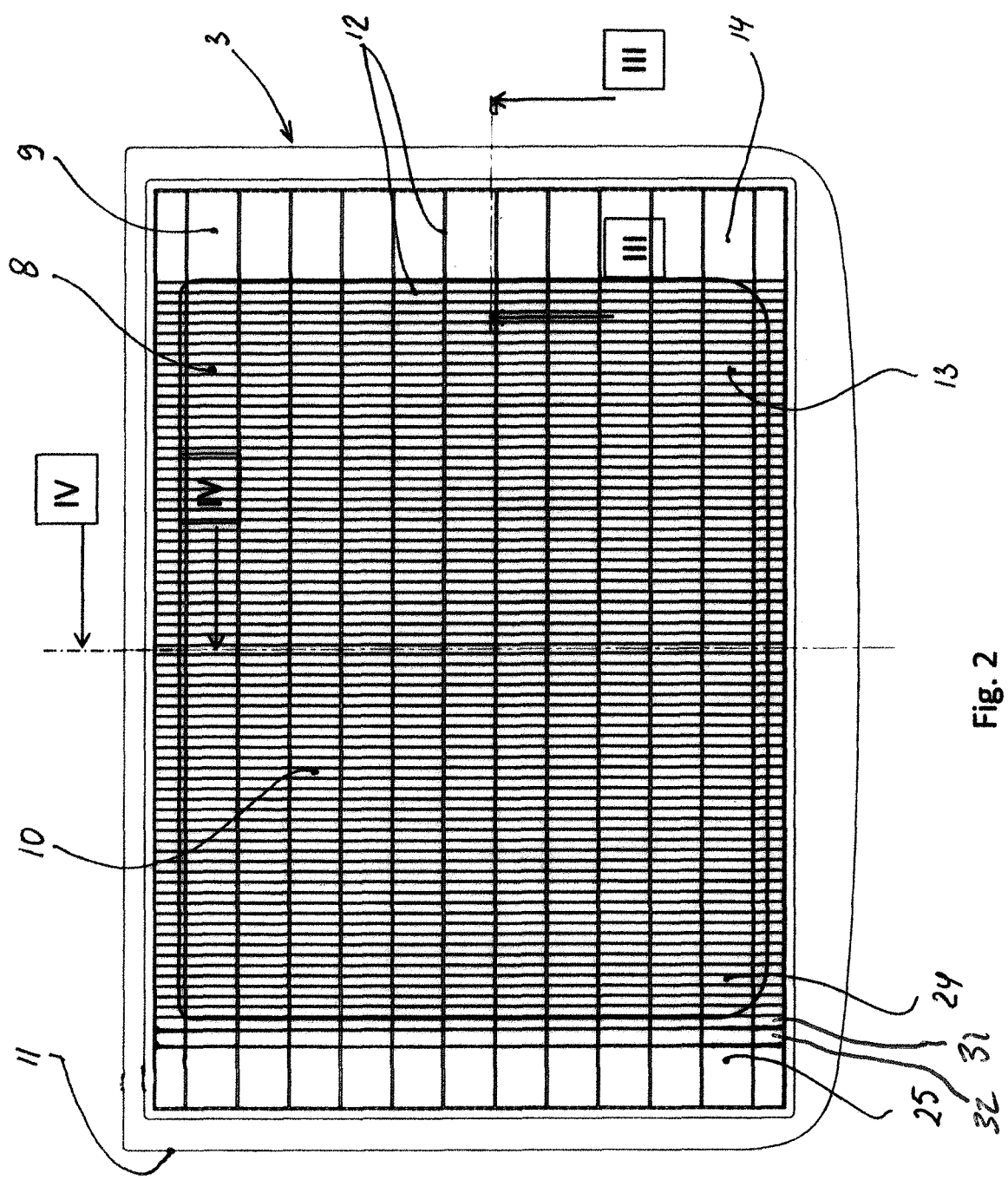
FIG. 2 is a plan view of the panel of the roof construction.

In FIG. 2 the forward panel 3 is shown and also the sheet of photovoltaic cells 6 is shown comprising sequences of photo voltaic cells by means of lines. These lines 12 are lines engraved into the active layer 7 of the sheet of photo voltaic cells 6. The lines 12 protrude through the active layer 7 and allow light through the sheet of photo voltaic cells 6. Thus when the panel 3 is in a closed position, closing the opening 1 in the fixed roof 2 in daylight conditions, a first area 8 below the center area 10 of the panel 3 will thus be lightened by light coming from the exterior of the vehicle. The second area 9 to the left and right of the semi-transparent center area of the panel 3 in FIG. 2 is an area which is opaque. It can be noticed that the sheet of photo voltaic cells 6 has a rectangular shape. This is beneficial when manufacturing the sheet, however it is conceivable that also other shapes can be manufactured, for instance a shape that follows the circumferential edge 11 of the panel. The photo voltaic cells are arranged in two types of sequences. The first sequence 13 is a sequence which is directed in a longitudinal direction, in other words in a direction from above to below (or vice versa) in FIG. 2.

Figure 3:
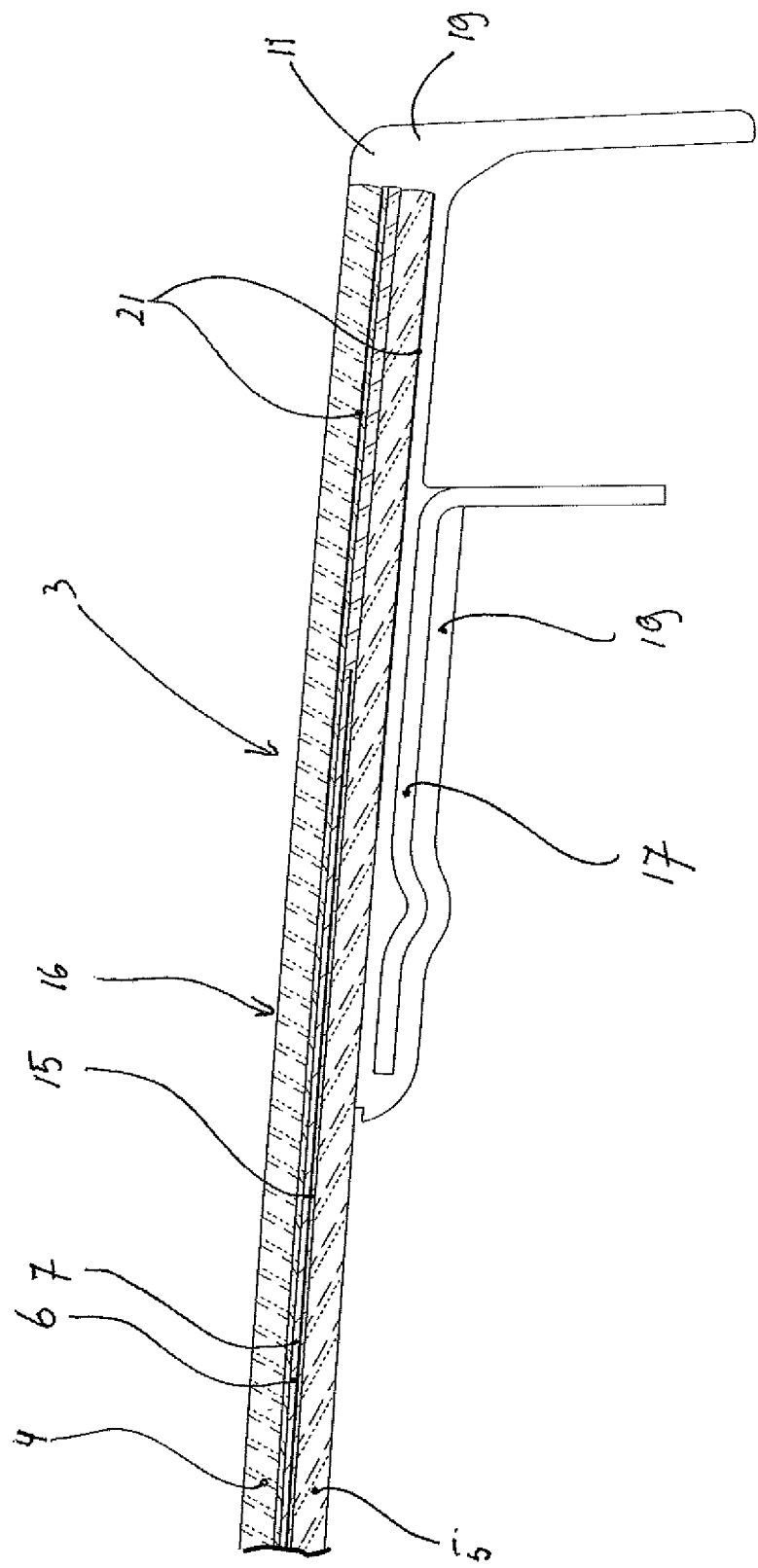
FIG. 3 is a section across the panel according to line in FIG. 2.

The photo voltaic cells in this first sequence 13 are connected in series to each other. Adjacent to this first sequence 13 a second sequence 14 can be observed perpendicularly directed in a transverse direction or seen in FIG. 2, in a left to right direction. This second sequence 14 comprises first sequences 13 of in series connected photo voltaic cells placed adjacent to each other and whereby the first sequences 13 at the beginning and the end of the first sequence are connected in parallel with each other. In case the photo voltaic cells are of the amorphous silicon type having a single junction build-up of the layers, each cell provides an electrical potential of 0.85 Volts. In this particular case the width of the second sequence 14 of photo voltaic cells 6 lies in between 2 and 12 mm, however a more optimal range is in between 4 and 10 mm. For the first sequence 13 the total electric potential of the in series connected photo voltaic cells 6 may add up to a maximum which does not exceed 60 Volts, and because the photo voltaic cells 6 in the second sequence 14 are connected to each other in parallel, the total voltage potential from the sheet of photovoltaic cells 6 shall not exceed 60 Volts. For esthetical and electrical reasons the width of each of the second sequences 14 should be the same and the number of the second sequences 14 should be an integer value. The first sequences 13 may extend in another direction as explained above, for instance in a transverse direction with respect to the longitudinal direction of the vehicle. In the second opaque area 9 engraved lines 12 are made only in a second transverse direction. So some light may enter through these lines 12 however there is a layer of black ink 15 placed on the lower side of the sheet of photovoltaic cells 6 which blocks rays of light entering these lines 12 as shown in FIG. 3. Furthermore in FIG. 2 photo voltaic cells 6 are shown having a first rectangular area 24 in the semi-transparent first area 8 of the panel 3 and the larger photo voltaic cells having a second rectangular area 25 in the second opaque area 9 of the panel 3. The boundary between these photo voltaic cells 6 having a first and a second rectangular area 24, 25 is a laser engraved line 12 extending in a first direction. It is conceivable that the difference between the first and second rectangular area 24, 25 is created by one or more photo voltaic cells 6 having a rectangular area that increases in step (s) 32 and 33 from the first rectangular area 24 to the second rectangular area 25.

In FIG. 3 a section is shown through part of the panel 3 according to line III-III of FIG. 2. The section shows a first and a second layer of glass 4, 5. Such layers of glass 4, 5 may be of semi tempered quality. Further a third layer is shown which is the sheet of photo voltaic cells 6 being in between the first and second layers 4, 5.

The lower side of the sheet of photo voltaic cells 6 comprises a layer of black ink 15 in an area near the edge 11 of the panel. This layer of black ink 15 may have a width extending from the edge of the photovoltaic sheet 6 to a line lying inwardly towards the center of the sheet 10.

Each of the layers of glass 4, 5 has a ceramic layer 21 positioned on the lower side of each of the glass layers 4, 5. These ceramic layers 21 reinforce the edge of the layers of glass 4, 5 and are opaque and extend over a distance which lies in a range of minimal 20 mm measured from the edge of the layers of glass 4, 5. The panel 3 further comprises an edge of encapsulation material 19 forming not only an additional edge 11 to the aforementioned layers, but also encapsulating a mechanism bracket 17, used for the connection to the rest of the open roof construction, i.e. the mechanism (which is not shown). Such encapsulation material 19 may be a PU material or a PVC material. The area of the encapsulation material 19 extending below the layers of glass 4, 5 may not be exposed to UV light to avoid that the adherence between the encapsulation material 19 and the glass material 4, 5 deteriorates. In order to protect this area of encapsulation material 19 below the glass layers 4, 5, the layers of ceramic material 21 and the layer of black ink 15 extend well over a projection of this encapsulated area such that no UV lighting reaches the encapsulation material 19. As is shown in FIG. 3 a small overlap exists in the projections of the ceramic layer 21 and the black ink layer 15.

Figure 4:
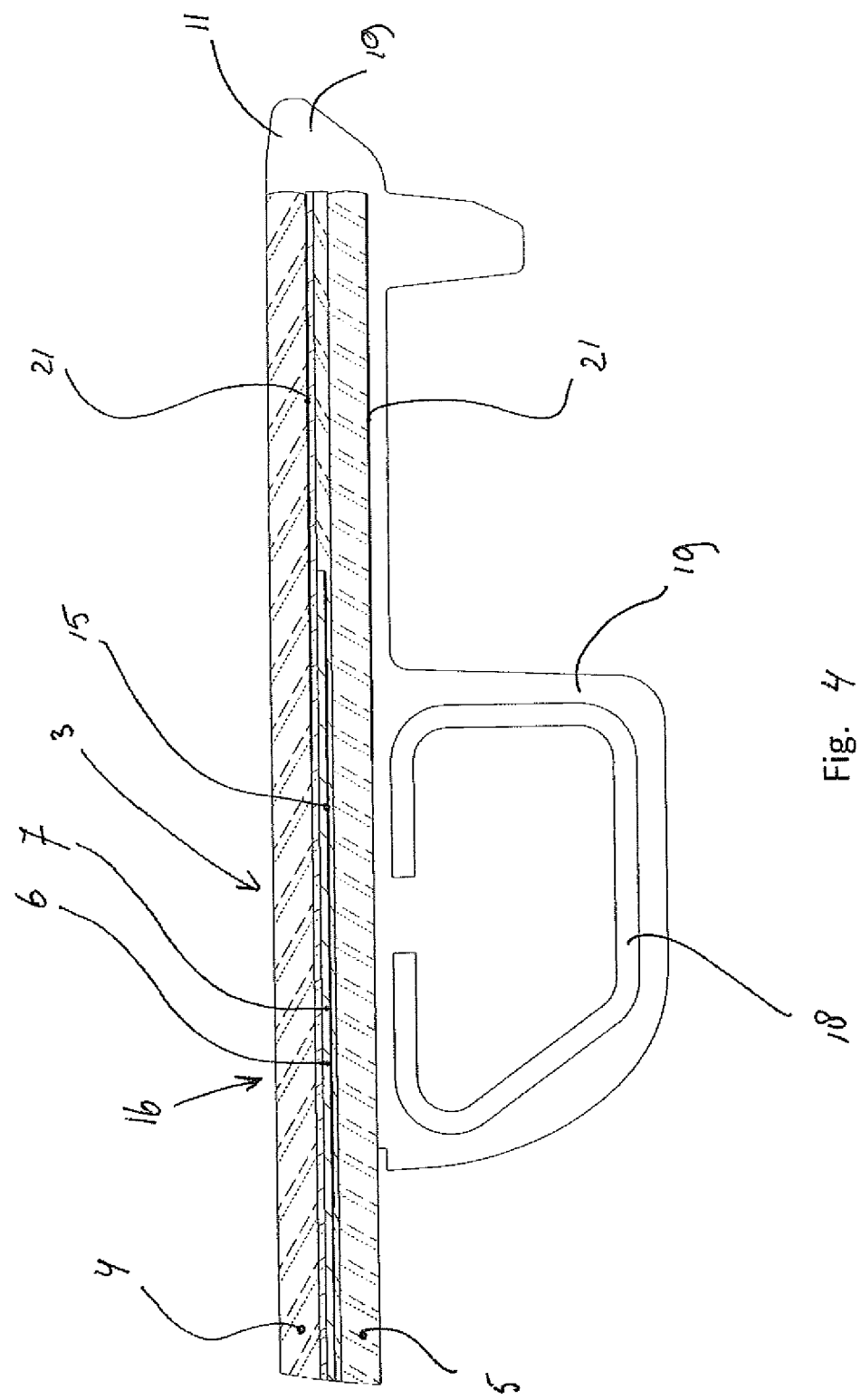
FIG. 4 is a sectional view according to line IV-IV in FIG. 2.

In FIG. 4 a sectional view of the panel 3 is shown according to line IV-IV. The encapsulation material 19 in this section encapsulates a reinforcement 18 below the lower surface of the glass layers 4, 5. Likewise as in FIG. 3 here, a layer of ceramic material 21 is shown formed on the lower side of each of the first and second layer of glass 4, 5. Also the layer of black ink 15 is shown. It is clear from FIG. 4 that the layer of black ink 15 extends from the edge of the sheet of photo voltaic cells 6 inwardly (to the left in FIG. 4) and stops at a certain point whereby the black ink layer 15 covers a projected area of encapsulation material 19 connected to the bottom side of the panel 3.

Figure 5:
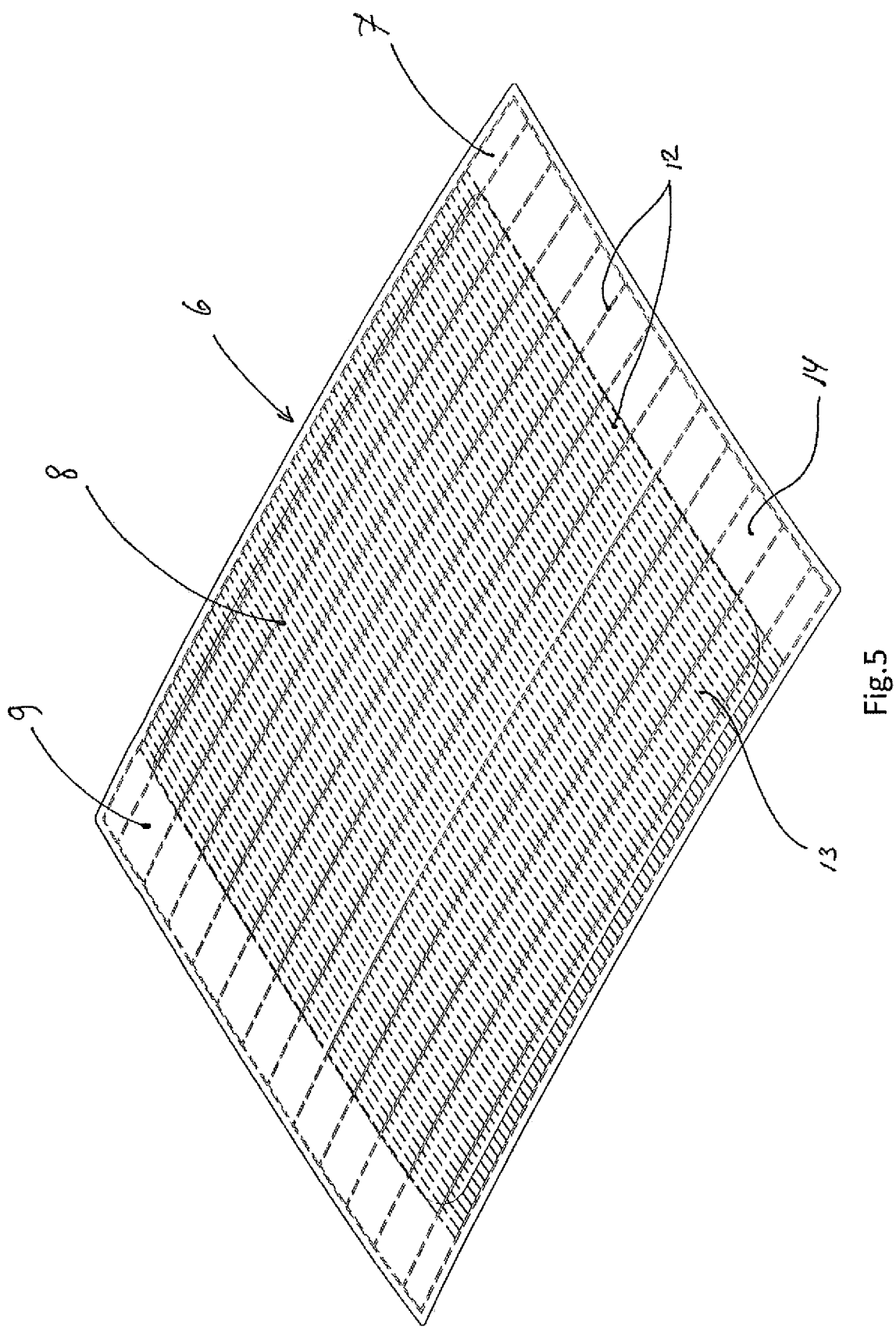
FIG. 5 is a perspective view of the sheet of photovoltaic cells showing the engraved lines by means of dotted lines.

In FIG. 5 the sheet of photo voltaic cells 6 is shown including the engraved lines 12 shown by the dotted lines, the semi-transparent first area 8 and the opaque second area 9.

Figure 6:
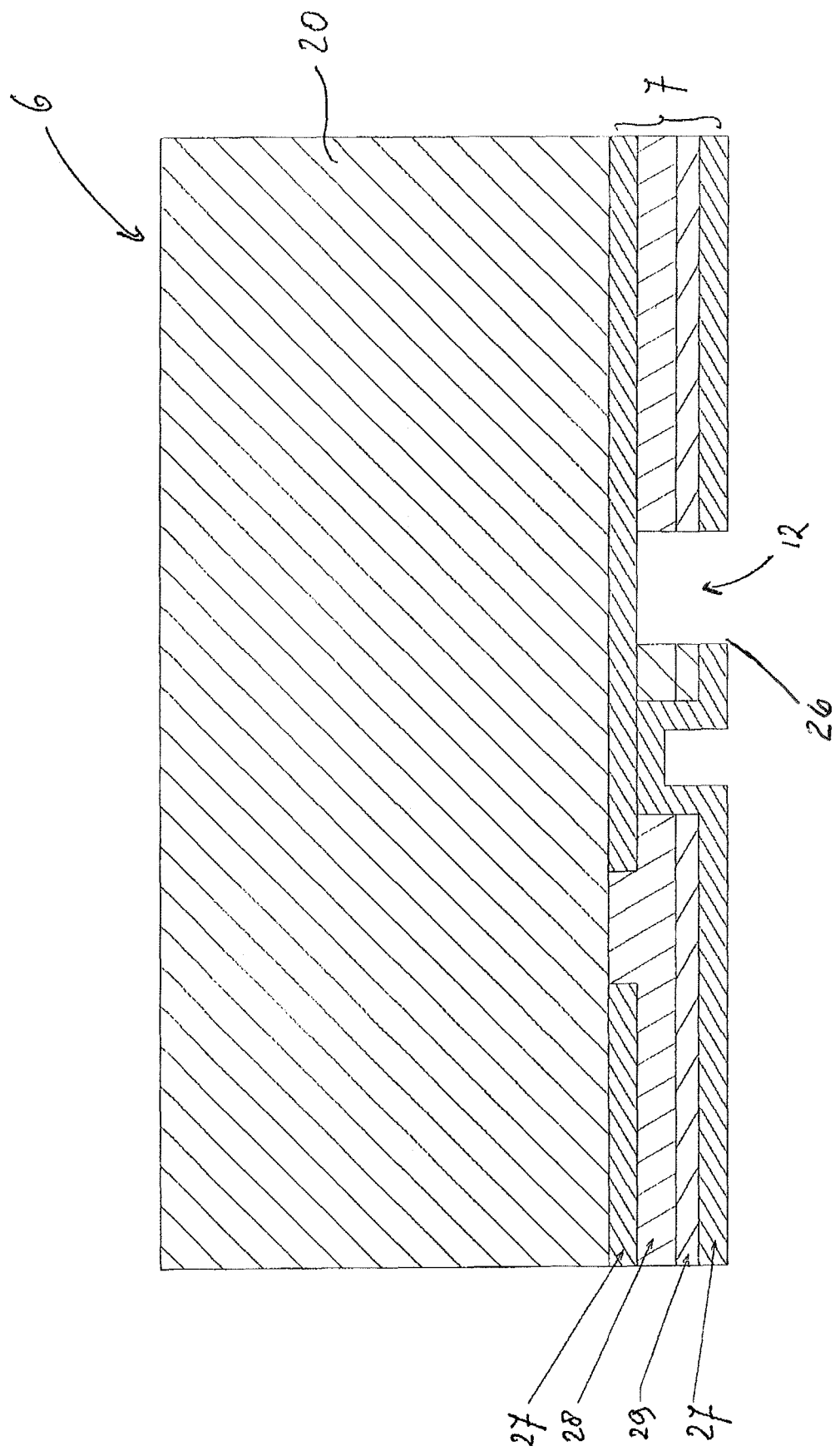
FIG. 6 is a detailed sectional view across the sheet of photo voltaic cells of FIG. 5, showing the active layers of a single junction amorphous silicon solar cell.

In FIG. 6 a section across the sheet of photo voltaic cells 6 of FIG. 5 is taken. The embodiment shown here is of an amorphous silicon material having a single junction build-up of the active material 7. The upper layer in the drawing is a support layer 20 which can be a layer of thin glass or a layer of plastic foil. The active layer 7 comprises a top layer 27 and a bottom layer 27 of TCO (transparent Conductive Oxide) material. The layers in between are respectively a layer of amorphous silicon 28 and a layer of micro crystalline silicon 29. Here in a section a laser engraved line 12, or a hole 26 described below, is shown which allows the passage of visible light from an upper side of the photo voltaic sheet 6 to a lower side of it in FIG. 6.

Figure 7:
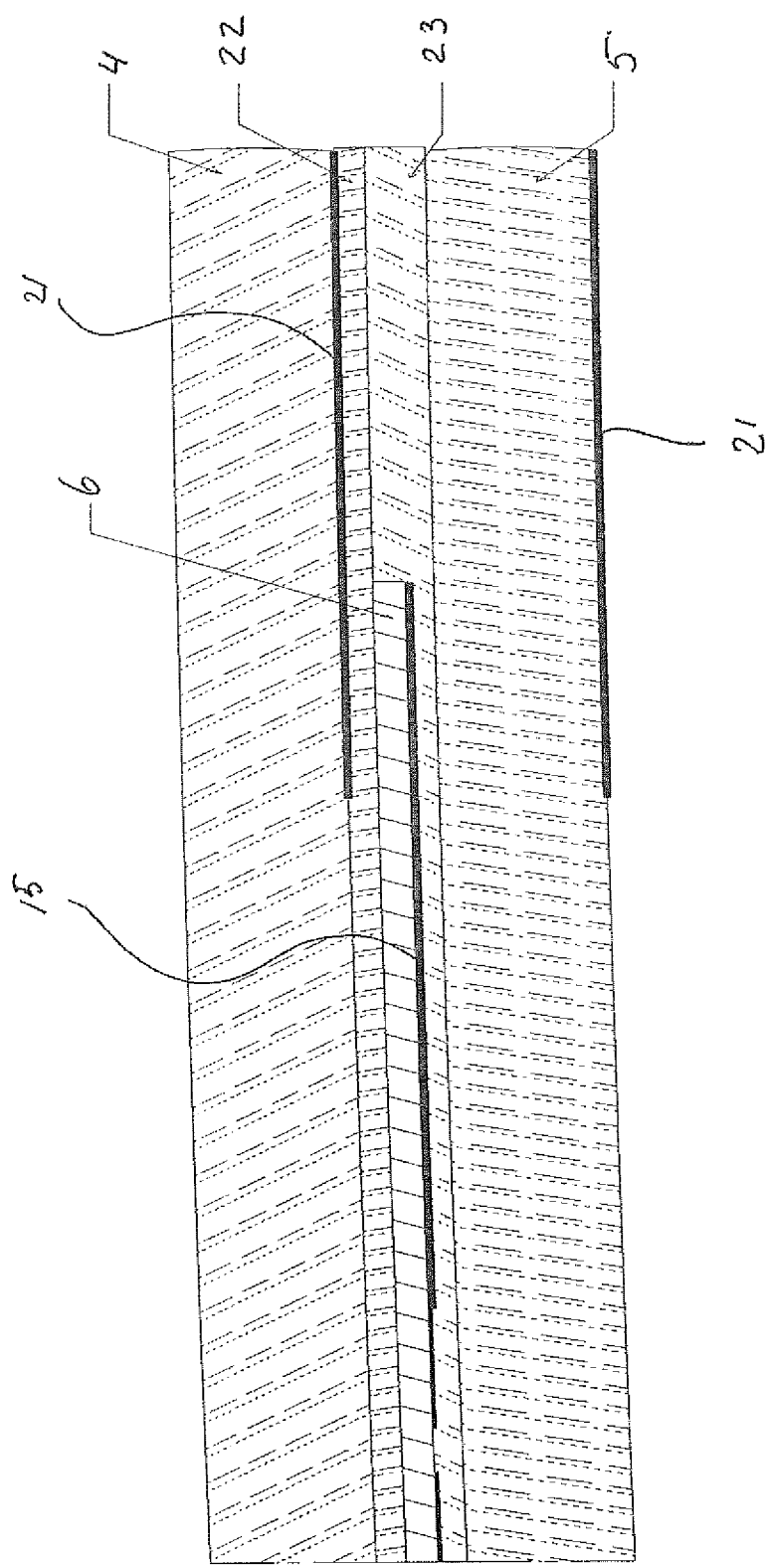
FIG. 7 is a view showing the various layers of which the panel is built up.

In FIG. 7 a close up sectional view of the panel 3 is shown without the encapsulation material 19. Both layers of glass 4, 5 are shown with ceramic layers 21, photo voltaic layer 6 is shown and the layer of black ink 15 on it. Here are also PVB layers 22, 23 shown which provide adherence of the layers of glass 4, 5 and the photo voltaic sheet 6 to each other.

The invention is not limited to the embodiments shown in the drawings and described above, which can be varied in different manners within the scope as defined by the appending claims. As such instead of creating semi transparency by means of straight lines 12, it is also possible to form other shapes by means of laser engraving such as circular holes 26 or by means of lines that are not straight. Also it is conceivable to have instead of a panel having two glass layers 4, 5 to have a panel with just one glass layer positioned as an upper layer forming a continuous surface with the fixed roof of the vehicle. The sheet of photo voltaic cells 6 forms a layer to the bottom side of the glass layer and is protected by one or more plastic PVB and EVA layers to avoid damages from below. Aspects of the various embodiments can be used in other combinations.

The invention claimed is:

1. A roof construction for a vehicle having an opening in its fixed roof, comprising at least one panel for at least closing said opening, said panel comprising a first and a second layer of glass and in between said first and second layer of glass a sheet of photo voltaic cells as a third layer,
    wherein the sheet of photo voltaic cells has an active layer of a thin film of solar cell material and further having a first area which is semi-transparent and a second area which is substantially opaque,
    wherein the semi-transparent first area is substantially located in a central area of the panel and the substantially opaque second area is located near an edge of the panel,
    wherein the semi-transparency of the photo voltaic cells in the first area comprises laser engraved lines or holes into the active layer of the photo voltaic cells such that visible light can travel through the engraved lines or holes,
    wherein the sheet of photo voltaic cells comprises sequences of individual photo voltaic cells, boundaries of which are formed by the laser engraved lines, and wherein the photo voltaic cells are electrically connected to each other, such that a first sequence of individual photo voltaic cells is electrically connected in series to each other and wherein said first sequence in series connected of photo voltaic cells extends adjacent to each other in a first direction of a major planar surface of the panel, and wherein second sequences of first sequences of in series connected photo voltaic cells are connected to each other in parallel and wherein said second sequences of first sequences of in series connected photo voltaic cells lie adjacent to each other in a second direction of the major planar surface, the second direction being perpendicular to the first direction, and wherein a boundary between the semi-transparent first area and opaque second area is created by sequences of in series and in parallel connected photo voltaic cells having cell areas that increase in steps from the first area to the second area.

2. The roof construction of claim 1, wherein widths of each of second sequences are the same.

3. The roof construction of 1, wherein the first direction of the first sequence of in series connected photo voltaic cells is a direction which is longitudinal with regard to a longitudinal direction of the vehicle.

4. The roof construction of claim 1, wherein a lower side of the sheet of photo voltaic cells is provided with a layer of black ink in a third area along a circumferential edge of said sheet of photo voltaic cells.

5. The roof construction of claim 4, wherein the third area, provided with the layer of black ink, covers an area which is a projection of an area on the lower side of the panel, comprising a mechanism bracket and or a reinforcement and material to fix said bracket and or reinforcement to the lower side of the panel by an encapsulation material or glue.

6. The roof construction of claim 1, wherein the sheet of photo voltaic cells comprises a thin support layer and deposited on the thin support layer, a thin layer of solar cell material which is the active layer.

7. The roof construction of claim 6, wherein the thin support layer is a thin film of chemical tempered glass or a layer of plastic foil having a thickness of smaller than 1 mm.

8. The roof construction of claim 6, wherein the thin film of solar cell material comprises a layer of amorphous silicon material.

9. The roof construction of claim 8, wherein the photo voltaic cells of amorphous silicon provided on the sheet of photo voltaic cells are either of the type of the so called semi-transparent single junction, semi-transparent tandem junction or triple junction.

10. The roof construction of claim 1, wherein the thin film of solar cell material being the active layer comprises a layer of either of CIGS material, CIS material or Perovskite material.

11. The roof construction of claim 1, wherein the panel comprises encapsulation material around a circumferential edge of the panel and wherein the first and second layers of glass comprise a ceramic layer on a lower side of each of said first and second layers.

12. The roof construction of claim 1, wherein a first sequence of in series connected photo voltaic cells in the semi-transparent first area has photo voltaic cells having a first rectangular area which is smaller than a larger second rectangular area of the photo voltaic cells in the second opaque area, and wherein a boundary between the semi-transparent first area and opaque second area is created by a sequence of laser engraved lines between photo voltaic cells having of the first rectangular area and photo voltaic cells having of the larger second rectangular area.

13. The roof construction of claim 1, wherein at least one panel is movable so as to form an open roof construction.

* * * * *